US010547314B1

(12) United States Patent
Braun (10) Patent No.: US 10,547,314 B1
(45) Date of Patent: Jan. 28, 2020

(54) SUPERCONDUCTING CIRCUITS AND METHODS FOR LATCHING DATA

(71) Applicant: Microsoft Technology Licensing, LLC, Redmond, WA (US)

(72) Inventor: Alexander L. Braun, Baltimore, MD (US)

(73) Assignee: Microsoft Technology Licensing, LLC, Redmond, WA (US)

(*) Notice: Subject to any disclaimer, the term of this patent is extended or adjusted under 35 U.S.C. 154(b) by 0 days.

(21) Appl. No.: 16/210,121

(22) Filed: Dec. 5, 2018

(51) Int. Cl.
*H03K 19/195* (2006.01)
*H03K 5/1534* (2006.01)
*H01L 39/12* (2006.01)
*H03K 5/00* (2006.01)
*H01L 39/22* (2006.01)

(52) U.S. Cl.
CPC ......... *H03K 19/195* (2013.01); *H03K 5/1534* (2013.01); *H01L 39/12* (2013.01); *H01L 39/223* (2013.01); *H03K 2005/00019* (2013.01); *H03K 2005/00234* (2013.01)

(58) Field of Classification Search
None
See application file for complete search history.

(56) References Cited

U.S. PATENT DOCUMENTS

| 4,501,975 A * | 2/1985 | Josephs | H03K 3/38 326/3 |
|---|---|---|---|
| 5,963,351 A | 10/1999 | Kaplounenko et al. | |
| 9,876,505 B1 | 1/2018 | Dai et al. | |
| 9,887,700 B2 * | 2/2018 | Carmean | H03K 19/195 |
| 10,090,841 B1 | 10/2018 | Herr | |
| 10,103,736 B1 | 10/2018 | Powell et al. | |

(Continued)

FOREIGN PATENT DOCUMENTS

JP 4690791 B2 6/2011
WO 2018203943 A2 11/2018

OTHER PUBLICATIONS

Przybysz, et al., "Interface Circuits for Chip-to-chip Data Transfer at GHz Rates", In Journal of IEEE Transactions on Applied Superconductivity, vol. 7, Issue 2, Jun. 1997, pp. 2657-2660.

*Primary Examiner* — Minh D A
*Assistant Examiner* — James H Cho
(74) *Attorney, Agent, or Firm* — Ranjeev Singh; Singh Law, PLLC (57) ABSTRACT

Superconducting circuits and methods for latching data are described. An example superconducting circuit includes an edge detect circuit configured to receive a logical clock signal and generate a return-to-zero clock signal. The superconducting circuit further includes a first latch configured to receive the logical clock signal and an input data signal, where the first latch is further configured to selectively delay the input data signal to generate a delayed data signal. The superconducting circuit further includes a second latch configured to receive the return-to-zero clock signal and the delayed data signal, where the second latch is further configured to capture a logical high value corresponding to the input data signal in response to a rising edge of the return-to-zero clock signal and capture a low logical value corresponding to the input data signal in response to a falling edge of the return-to-zero clock signal.

20 Claims, 9 Drawing Sheets

(56) References Cited

U.S. PATENT DOCUMENTS

| | | | |
|---|---|---|---|
| 2003/0016069 A1 | 1/2003 | Furuta et al. | |
| 2006/0259890 A1* | 11/2006 | Tschanz | G06F 17/5045<br>326/93 |
| 2007/0182473 A1* | 8/2007 | Pacha | H03K 3/012<br>327/218 |

* cited by examiner

SUPERCONDUCTING CIRCUITS AND METHODS FOR LATCHING DATA

BACKGROUND

Semiconductor based integrated circuits used in electronic devices, such as digital processors, include digital circuits based on complimentary metal-oxide semiconductor (CMOS) technology. CMOS technology, however, is reaching its limits in terms of the device size. In addition, power consumption at high clock speeds by digital circuits based on the CMOS technology has increasingly become a limiting factor in high performance digital circuits and systems.

As an example, servers in a data center are increasingly consuming large amounts of power. The consumption of power is partly the result of power loss from the dissipation of energy even when the CMOS circuits are inactive. This is because even when such circuits are inactive, and are not consuming any dynamic power, they still consume power because of the need to maintain the state of CMOS transistors. In addition, because CMOS circuits are powered using DC voltage, there is a certain amount of current leakage even when the CMOS circuits are inactive. Thus, even when such circuits are not processing information, a certain amount of power is wasted not only as a result of the requirement to maintain the state of the CMOS transistors, but also as a result of the current leakage.

An alternative approach to the use of processors and related components, based on CMOS technology, is the use of superconducting logic based circuits.

SUMMARY

In one example, the present disclosure relates to a superconducting circuit for latching data. The superconducting circuit may include an edge detect circuit configured to receive a logical clock signal, where the edge detect circuit is further configured to generate a return-to-zero clock signal. The superconducting circuit may further include a first latch configured to receive the logical clock signal and an input data signal, where the first latch is further configured to selectively delay the input data signal to generate a delayed data signal. The superconducting circuit may further include a second latch configured to receive the return-to-zero clock signal and the delayed data signal, where the second latch is further configured to capture a logical high value corresponding to the input data signal in response to a rising edge of the return-to-zero clock signal, and where the second latch is further configured to capture a low logical value corresponding to the input data signal in response to a falling edge of the return-to-zero clock signal.

In another aspect, the present disclosure relates to a method of operating a superconducting circuit. The method may include receiving a logical clock signal and processing the logical clock signal to generate a return-to-zero clock signal. The method may further include using a first latch configured to receive the logical clock signal, selectively delaying the input data signal to generate a delayed input data signal. The method may further include using a second latch configured to receive the return-to-zero clock signal, receiving the delayed input data signal and capturing a logical high value corresponding to the input data signal only in response to a rising edge of the return-to-zero clock signal and capturing a logical low value corresponding to the input data signal in response to a falling edge of the return-to-zero clock signal.

In yet another aspect, the present disclosure relates to a superconducting circuit comprising an edge detect circuit configured to receive a first clock signal, where the edge detect circuit is configured to generate a second clock signal. The superconducting circuit may further include a master latch configured to receive the first clock signal and an input data signal, where the master latch is further configured to selectively delay the input data signal to generate a delayed data signal. The superconducting circuit may further include a slave latch configured to receive the second clock signal and the delayed data signal, where the slave latch is further configured to capture a logical high value corresponding to the input data signal only at a rising edge of the second clock signal, and where the slave latch is further configured to capture a logical low value of the input data signal only at a falling edge of the second clock signal.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Examples described in this disclosure relate to superconducting circuits and method for latching data. Certain other examples relate to edge-triggered superconducting circuits for latching data. Such RQL circuits that may act as low-power superconductor logic circuits. Unlike CMOS transistors, the RQL circuits are superconductor circuits that use Josephson junction based devices. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the RQL circuits. As an example, superconductors are materials that can carry a direct electrical current (DC) in the absence of an electric field. Such materials have almost zero resistance at or below their critical temperature. One example superconductor, Niobium, has a critical temperature (Tc) of 9.3 Kelvin. At temperatures below Tc, Niobium is superconductive; however, at temperatures above Tc, it behaves as a normal metal with electrical resistance. Thus, in the SIS type of Josephson junctions, superconductors may be Niobium superconductors and insulators may be $Al_2O_3$ barriers. In SIS type of junctions, when a wave function tunnels through the barrier, a changing phase difference in time in the two superconductors creates a potential difference between the two superconductors. In RQL circuits, in one example, the SIS type of junction may be part of a superconducting loop. When the potential difference between the two superconductors is integrated with respect to time over one cycle of phase change, the magnetic flux through the loop changes by an integer multiple of a single quantum of magnetic flux. The voltage pulse associated with the single quantum of magnetic flux is referred to as a single-flux-quantum (SFQ) pulse. As an example, overdamped Josephson junctions can create individual single-flux-quantum (SFQ) pulses. In RQL circuits, each Josephson junction may be part of one or more superconducting loops. The phase difference across the junction may be modulated by the magnetic flux applied to the loop.

Various RQL circuits including transmission lines can be formed by coupling multiple Josephson junctions by inductors or other components, as needed. SFQ pulses can travel via these transmission lines under the control of at least one clock. The SFQ pulses can be positive or negative. As an example, when a sinusoidal bias current is supplied to a junction, then both positive and negative pulses can travel rightward, during opposite clock phases, on a transmission line. The RQL circuits may advantageously have zero static power dissipation because of the absence of bias resistors. In addition, the RQL circuits may be powered using alternating current (AC) power, thereby eliminating the ground return current. The AC power supply may also act as a stable clock reference signal for the RQL circuits. In one example, the digital data may be encoded using The Josephson junction superconducting phase. Positive and negative (reciprocal) SFQ pulses may be used to change the superconducting phase of the Josephson junction. A positive SFQ pulse may arrive during the positive part of a clock and a negative SFQ pulse may arrive during the negative part of the clock.

Certain examples described herein relate to superconducting circuits and method for latching data. Example superconducting circuits may include an edge detect circuit and two latches. One of the latches may be configured as a master latch and other latch may be configured as a slave latch. As used herein the term master latch may mean a latch that receives a data signal and generates another data signal and the term slave latch may mean a latch that receives the data signal generated by the master latch. The input data signal received via the master latch may only be sampled at the rising edge of the logical clock signal and then provided via the slave latch as an output. The input data signal may change its value, but that will not change the output at the output terminal as long as the logical clock signal does not have a subsequent rising edge.

The master latch may be clocked by a phase mode logic clock signal that may have a high duty-cycle waveform and the slave latch may be clocked by a return-to-zero pulse pair derived from only the rising edge of the clock being used to clock the master latch. The return-to-zero pulse pair may be generated using an edge detect circuit. The master latch may be used to selectively delay pulses arriving as the input data signal to allow the slave latch to cleanly capture any data values arriving prior to the rising edge of the clock corresponding to the master latch, but none of the data values arriving after the rising edge of the clock corresponding to the master latch. In this manner the superconducting circuit may function as an edge-triggered flip-flop and this may advantageously allow the mapping of existing CMOS technology-based designs for use with superconducting logic-based designs.

Figure 1:
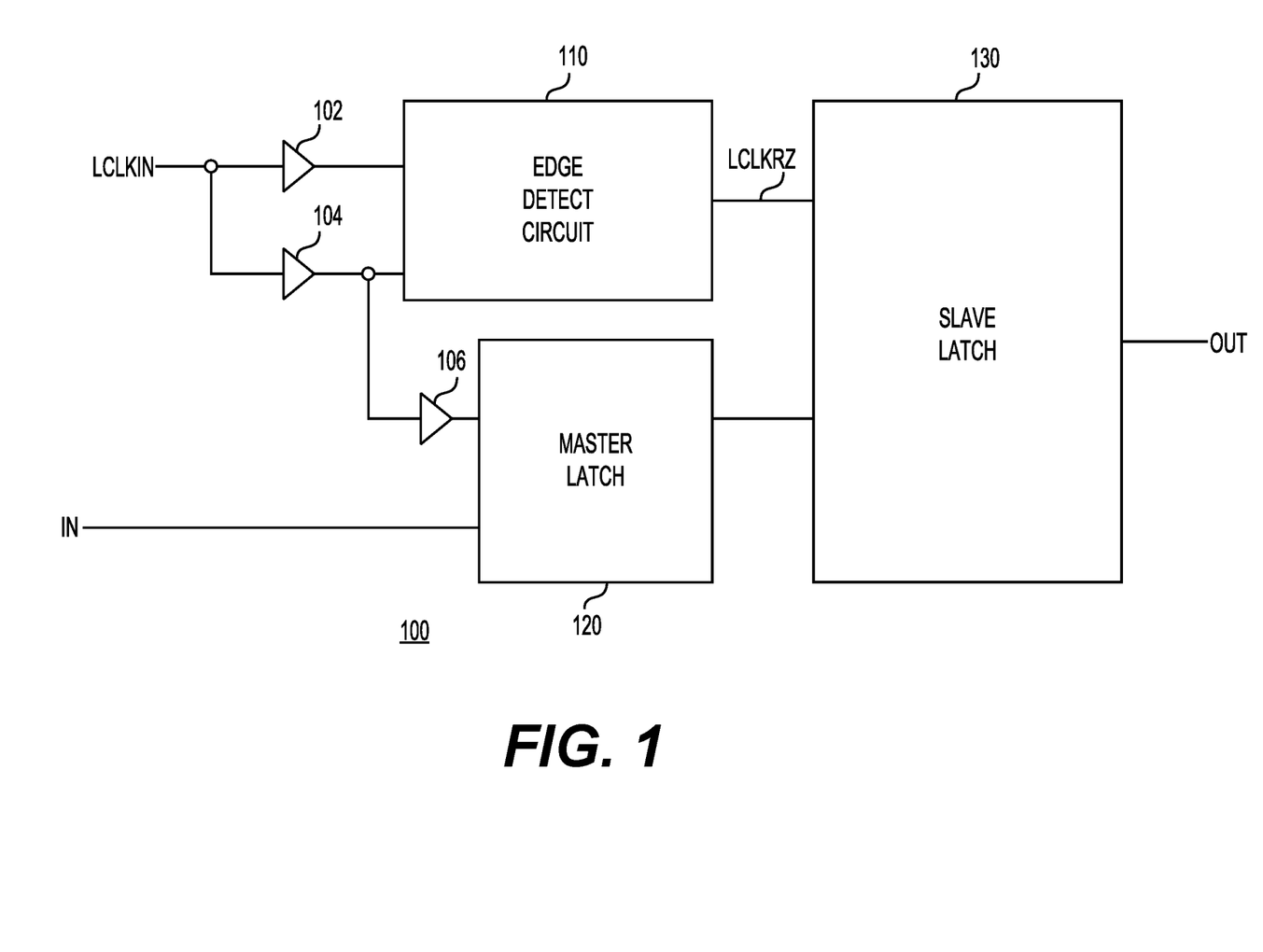
FIG. 1 is a diagram of an edge-triggered superconducting circuit for latching data in accordance with one example.

FIG. 1 is a diagram of an edge-triggered superconducting circuit 100 for latching data in accordance with one example. In this example, superconducting circuit 100 may act as an edge-triggered flip-flop.

Superconducting circuit 100 may include an edge detect circuit 110, a master latch 120, and a slave latch 130. A logical clock signal may be received via the LCLKIN terminal and coupled via a Josephson transmission line (JTL) 102 to edge detect circuit 110. Another instance of the logical clock signal may be coupled to edge detect circuit 110 via JTL 104. The output of JTL 104 may be coupled to another JTL 106, which in turn may provide the logical clock signal to master latch 120. Edge detect circuit 110 may be configured to generate a return-to-zero clock signal at the LCLKRZ terminal by processing the logical clock signal received via the LCLKIN terminal. Master latch 120 may be configured to receive not only the logical clock signal but also an input data signal via the IN terminal. Master latch 120 may be configured to delay the received input data signal and provide the delayed version to slave latch 130. Slave latch 130 may be configured to capture a logical "1" value of the input data signal only at the rising edge of the return-to-zero clock signal and capture a logical "0" value of the input data signal only at the falling edge of the return-to-zero clock signal. Each of the components of edge-triggered superconducting circuit 100 for latching data may be powered using an AC clock cycle. Different phases of the AC clock may be used to ensure correct operation of the circuit. Although FIG. 1 shows a certain number of components of edge-triggered superconducting circuit 100 for latching data arranged in a certain manner, there could be more or fewer number of components arranged differently.

Figure 2:
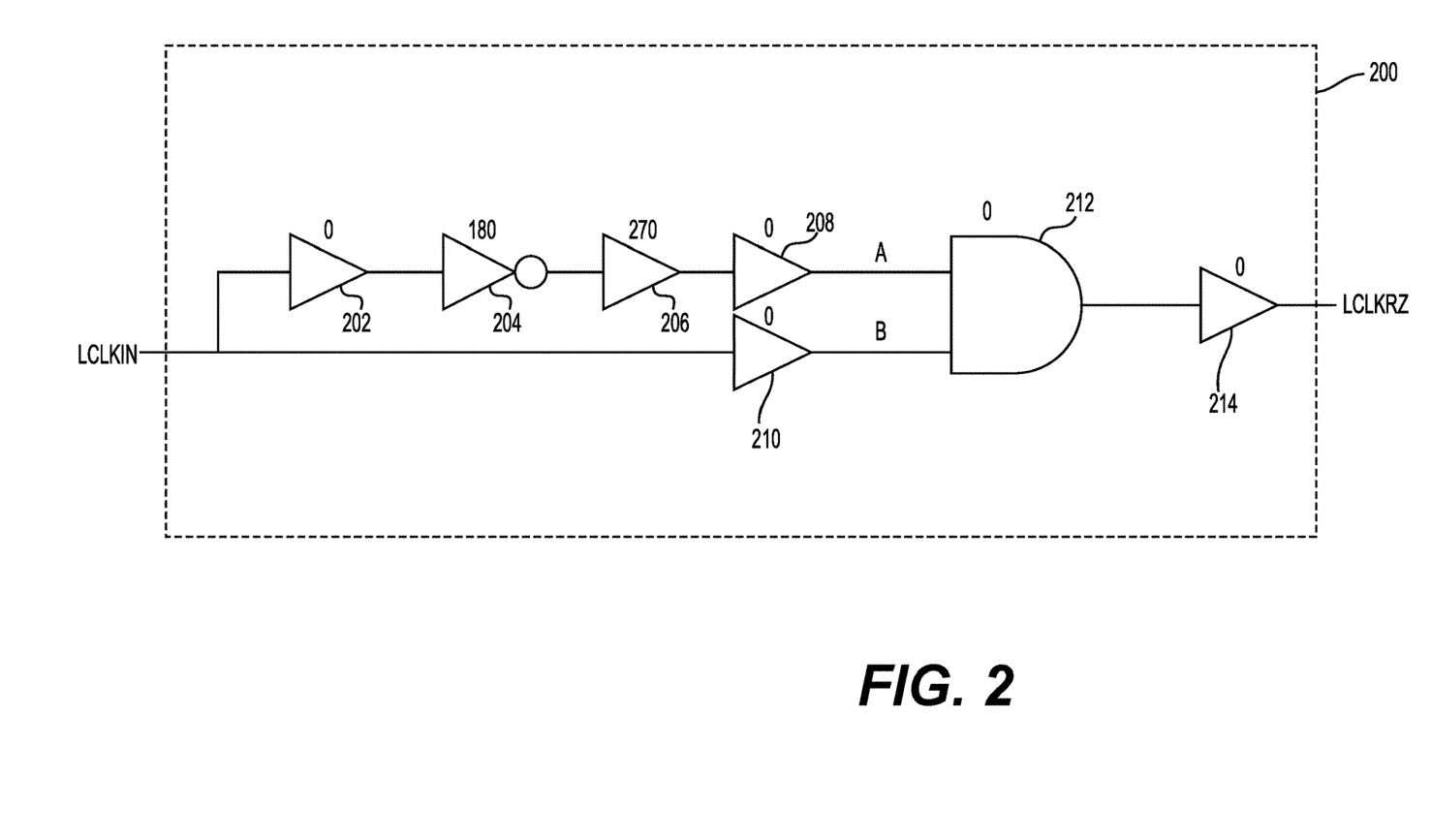
FIG. 2 is a diagram of an edge detect circuit in accordance with one example.

FIG. 2 is a diagram of an edge detect circuit 200 in accordance with one example. In this example, edge detect circuit 200 may be used to implement edge detect circuit 110 of FIG. 1. In FIG. 2, the phase of the AC signal used to power and/or bias the various components of edge detect circuit 200 are shown next to the components. These phase values are relative and thus absolute values shown in FIG. 2 may be different depending upon the phase of the AC signal applied to the first component of edge detect circuit 200. In addition, variations in the phasing may be possible as long as the relationship between the bias provided via the various bias terminals is preserved. Edge detect circuit 200 may include a JTL 202, which may be powered by an AC signal having a phase of 0 degrees, which may be coupled to the LCLKIN terminal to receive the logical clock signal. The output of JTL 202 may be provided to an inverter 204 powered by an AC signal having a phase of 180 degrees. The output of inverter 204 may be provided to a JTL 206 powered by an AC signal having a phase of 270 degrees. The output of JTL 206 may be provided to another JTL 208 powered by an AC signal having a phase of 0 degrees. The output of JTL 208 may be coupled to one of the inputs (input labeled A) of an AND gate 212 powered by an AC signal having a phase of 0 degrees. The other input (input labeled B) may be coupled to another JTL 210 powered by an AC signal having a phase of 0 degrees and JTL 210 may be configured to receive the logical clock signal. The output of AND gate 212 may be provided to a JTL 214, which in turn may provide a return-to-zero signal, which may be provided as an input to the slave latch via the LCLKRZ terminal. The operation of edge detect circuit 200 is further described as part of the description of FIG. 3. Although FIG. 2 shows a certain number of components of edge detect circuit 200 arranged in a certain manner, there could be more or fewer number of components arranged differently.

Figure 3:
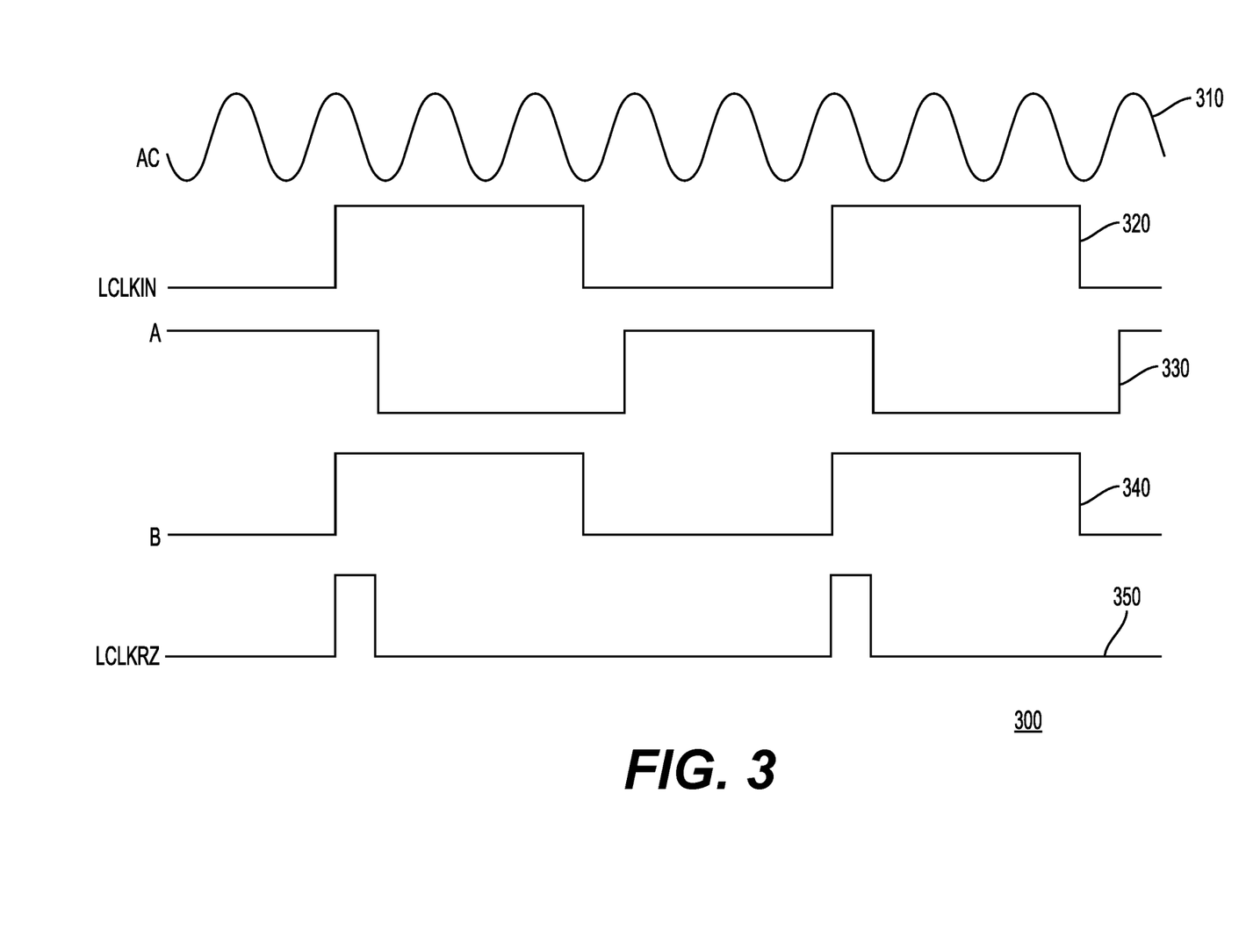
FIG. 3 shows waveforms associated with the edge detect circuit of FIG. 2 in accordance with one example.

FIG. 3 shows waveforms 300 associated with edge detection circuit 200 of FIG. 2 in accordance with one example. Waveform 310 shows the AC signal used for powering at least one of the components of edge detect circuit 200. Other AC signals having a different phase (as needed) may be used to power other components. Waveforms 320, 330, 340, and 350 are plotted in superconducting phase. In these waveforms, rising edges correspond to positive SFQ pulses and falling edges correspond to negative SFQ pulses. Waveform 320 shows the logical clock signal (received via the LCLKIN terminal), which may be approximately a square wave. Clock signals having other duty cycles may also be used as long as the period corresponding to the high value is at least 1.5 AC clock cycles long. As shown in FIG. 2, the logical clock signal is provided unaltered to one of the inputs (input labeled A) of AND gate 212. Waveform 330 represents the signal provided to the input labeled A. The other input (input labeled B) is configured to receive an inverted (e.g., inverted by inverter 204) and a delayed version (e.g., delayed due to the selected phases of the AC bias for the inverter and the JTL components shown in FIG. 2). Waveform 340 represents the signal provided to the input labeled B. A logical AND operation is performed by AND gate 212 on the signals corresponding to waveforms 330 and 340. Waveform 350 represents the result of the logical AND operation. A return-to-zero pulse pair is created by edge detect circuit 200 for each rising edge of the logical clock signal, but no output is generated for the falling edge of the logical clock signal. The output of edge detect circuit is provided via LCLKRZ terminal to slave latch 130.

Figure 4:
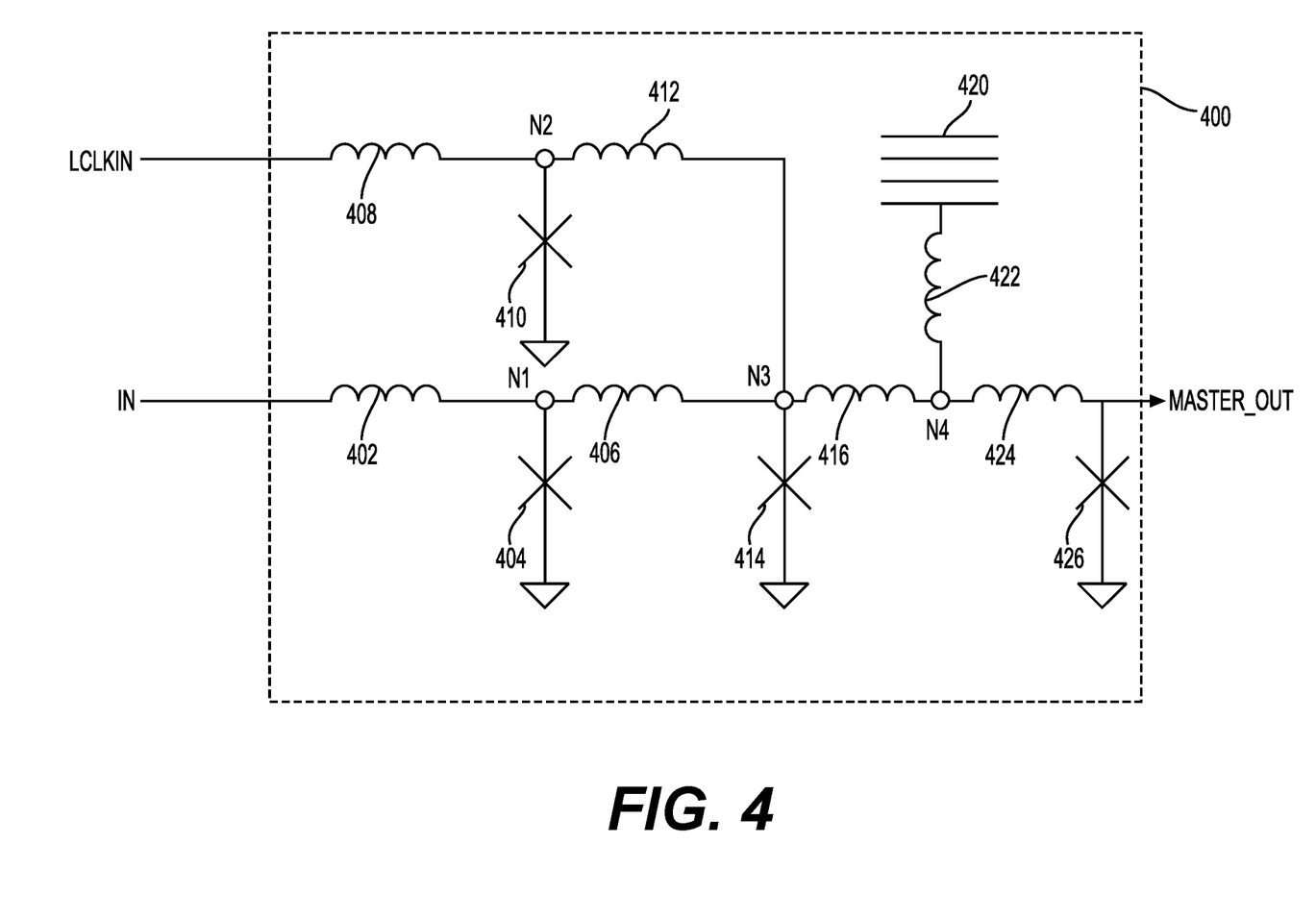
FIG. 4 is a diagram of a master latch in accordance with one example.

FIG. 4 is a diagram of a master latch 400 in accordance with one example. Master latch 400 may be configured to receive the logical clock via the LCLKIN terminal and the input data signal via the IN terminal. Master latch 400 may include components to receive these signals and components forming storage loops for storing current corresponding to the received signals. An inductor 402 may receive the input data signal. Inductor 402 may be coupled to a node N1. A Josephson junction (JJ) 404 may be couple between the node N1 and a ground terminal. Another inductor 406 may be coupled between node N1 and another node N3. JJ 414 may be coupled between the node N3 and the ground terminal.

With continued reference to FIG. 4, an inductor 408 may receive the logical lock signal. Inductor 408 may be coupled to a node N2. JJ 410 may be coupled between the node N2 and the ground terminal. Another inductor 412 may be coupled between the node N2 and another node N3. JJ 414 may be coupled between the node N3 and the ground terminal. Inductor 416 may be coupled between the node N3 and node N4. Node N4 may also be coupled to a biasing terminal 420 via an inductor 422. Inductor 424 may be coupled between the node N4 and the MASTER_OUT terminal. JJ 426 may be coupled between the MASTER_OUT terminal and the ground terminal.

With continued reference to FIG. 4, in terms of the operation of master latch 400, incoming logical clock signal (e.g., including pulses) may trigger JJ 410 storing a single quantum flux ($\Phi$) in the storage loop composed of JJ 410 and JJ 414 as well as inductor 412. The stored current may be either positive or negative depending upon the polarity of the triggering pulse and the state of the latch. Incoming pulses on the input terminal IN will similarly put current in the storage loop formed by JJ 404, JJ 414, and inductor 406. The latching operation occurs at JJ 414, which will trigger in the direction of the inputs when both inputs (the input received via the LCLKIN terminal and the input terminal IN) are in agreement. When the two inputs are in different states, JJ 414 will retain its previous state. Additionally, the input junctions JJ 410 and JJ 404 are sized relatively large such that the current stored in their associated storage inductors is never sufficient to trigger them. This allows the quantizing loop to hold their current across multiple AC clock cycles. Thus, in this example, there is no need for the input pulses to arrive in the same AC clock cycle at the LCLKIN terminal and the input terminal IN. JJ 426 is provided for additional output amplification.

With continued reference to FIG. 4, in this example, master latch 400 is configured such that the slave latch will never see a falling edge at its input while the logical clock is high, and it will never see a rising edge arriving at its input while the logical clock is low. Doing so effectively guarantees that the slave latch coupled to master latch 400 will always see the same data value for both edges of the return-to-clock signal. In other words, in this example master latch 400 may be used to condition the input data signal so that the hold requirement of the slave latch is always met. Although FIG. 4 shows a certain number of components of master latch 400 arranged in a certain manner, there could be more or fewer number of components arranged differently.

Figure 5:
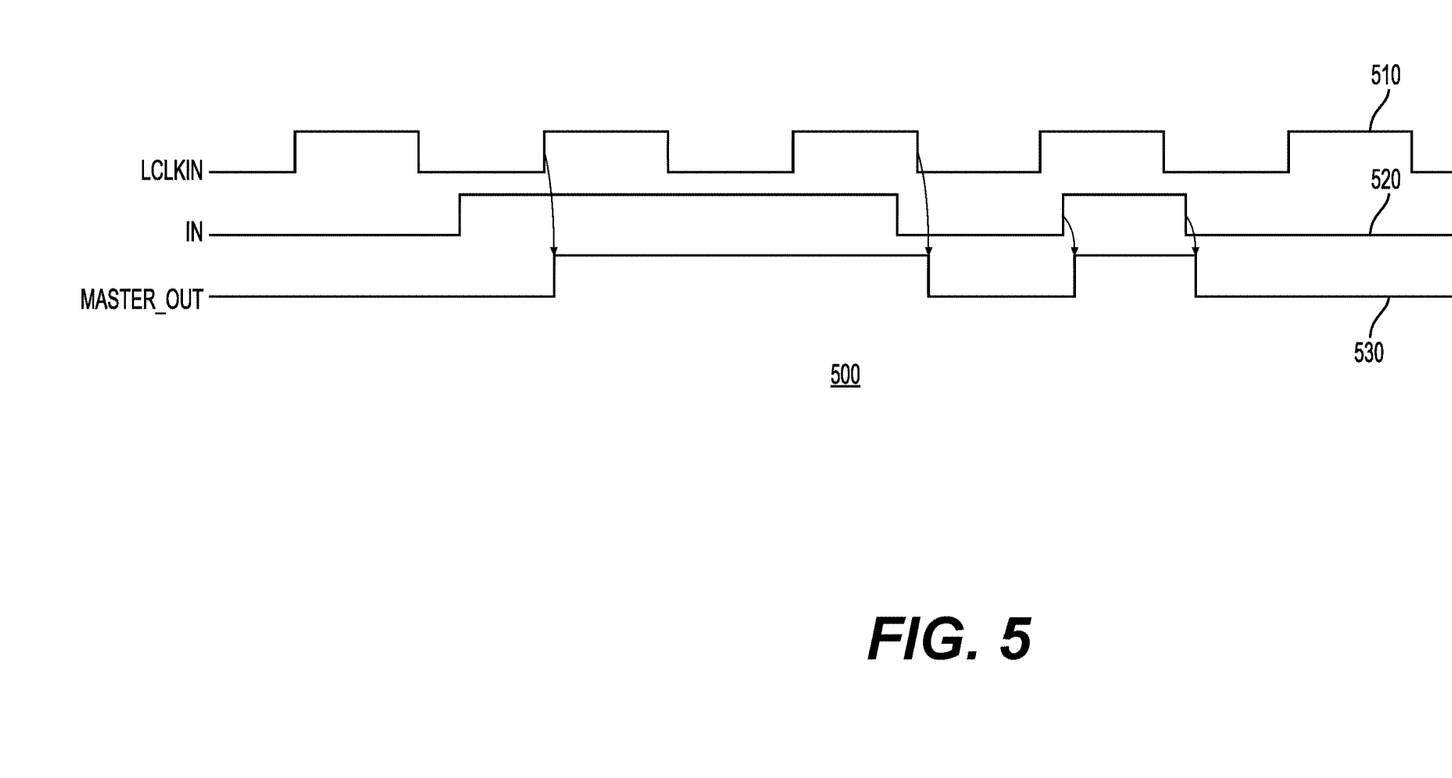
FIG. 5 shows waveforms associated with the master latch of FIG. 4 in accordance with one example.
Figure 6:
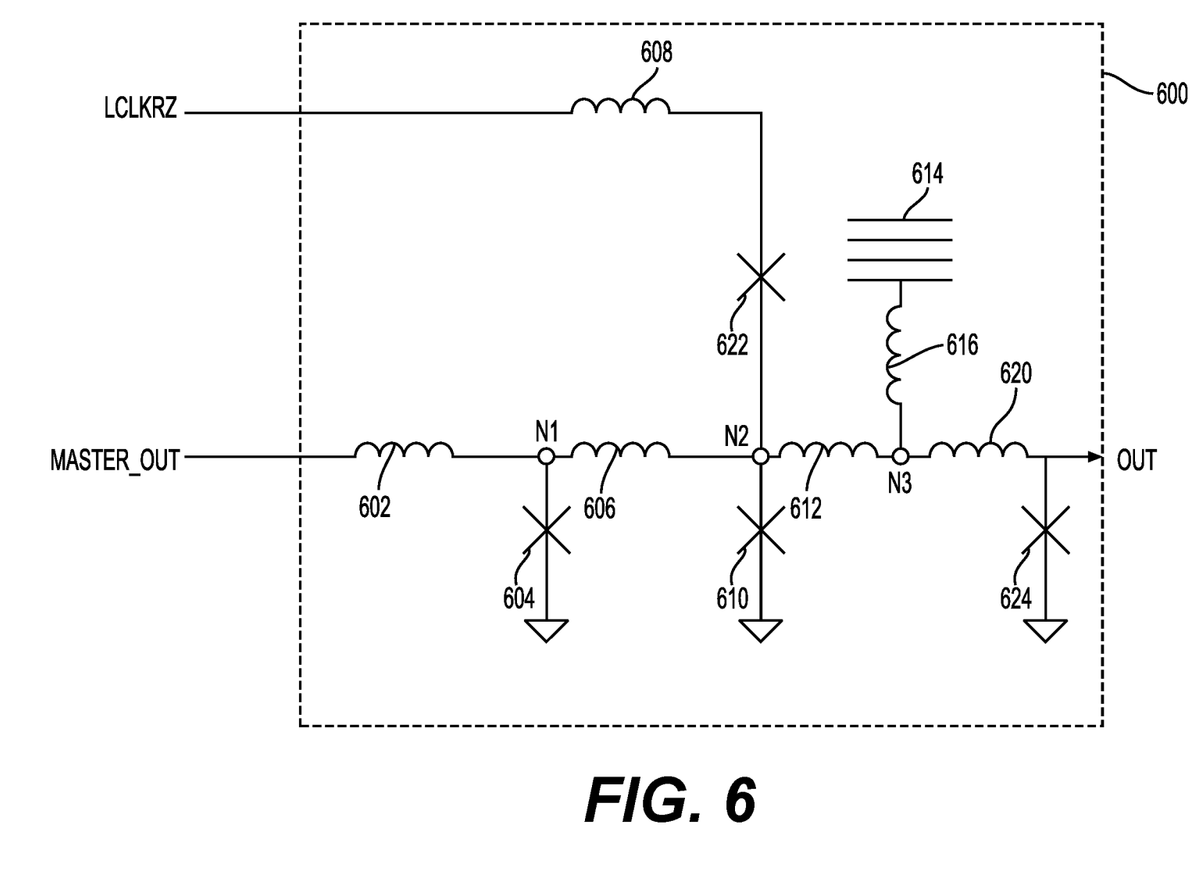
FIG. 6 is a diagram of a slave latch in accordance with one example.

FIG. 5 shows waveforms 500 associated with the master latch of FIG. 4, plotted in superconducting phase, in accordance with one example. The included waveforms illustrate the logical operation of master latch 400. Waveform 510 represents the logical clock signal received via the LCKLKIN terminal. Waveform 520 represents the input signal received via the input terminal IN. In this example, either input is capable of triggering a change in the output, but the change only occurs when both inputs are in agreement. Waveform 530 shows the output signal at the MASTER_OUT terminal. A logical description in Verilog of the function performed by the example master latch 400 is shown in the equation below:

always @(LCLKIN or IN)
   if (LCLKIN==1'b1 and IN==1'b1)
      MASTER_OUT<=1'b1;
   if (LCLKIN==1'b0 and IN==1'b0)
      MASTER_OUT<=1130);

FIG. 6 is a diagram of a slave latch 600 in accordance with one example. Slave latch 600 may be configured to receive a return-to-zero clock signal via the LCLKRZ terminal and another input signal via the MASTER_OUT terminal. As described earlier, edge detect circuit 200 may generate the return-to-zero clock signal. Slave latch 600 may be sensitive to both the rising edge and the falling edge of the return-to-zero signal. An inductor 602 may receive the data signal. Inductor 602 may be coupled to a node N1. A Josephson junction (JJ) 604 may be couple between the node N1 and a ground terminal. Another inductor 606 may be coupled between node N1 and another node N2. JJ 610 may be coupled between the node N2 and the ground terminal.

With continued reference to FIG. 6, an inductor 608 may receive the logical lock signal. Inductor 608 may be coupled to one end of a JJ 622. The other end of JJ 622 may be coupled to the node N2. Another inductor 612 may be coupled between the node N2 and another node N3. The node N3 may also be coupled to a biasing terminal 614 via an inductor 616. In this example, the biasing terminal is configured to receive an AC bias that is 90 degrees later relative to the AC bias applied to master latch 400. Inductor 620 may be coupled between the node N3 and the output terminal OUT. JJ 624 may be coupled between the output terminal OUT and the ground terminal.

Figure 7:
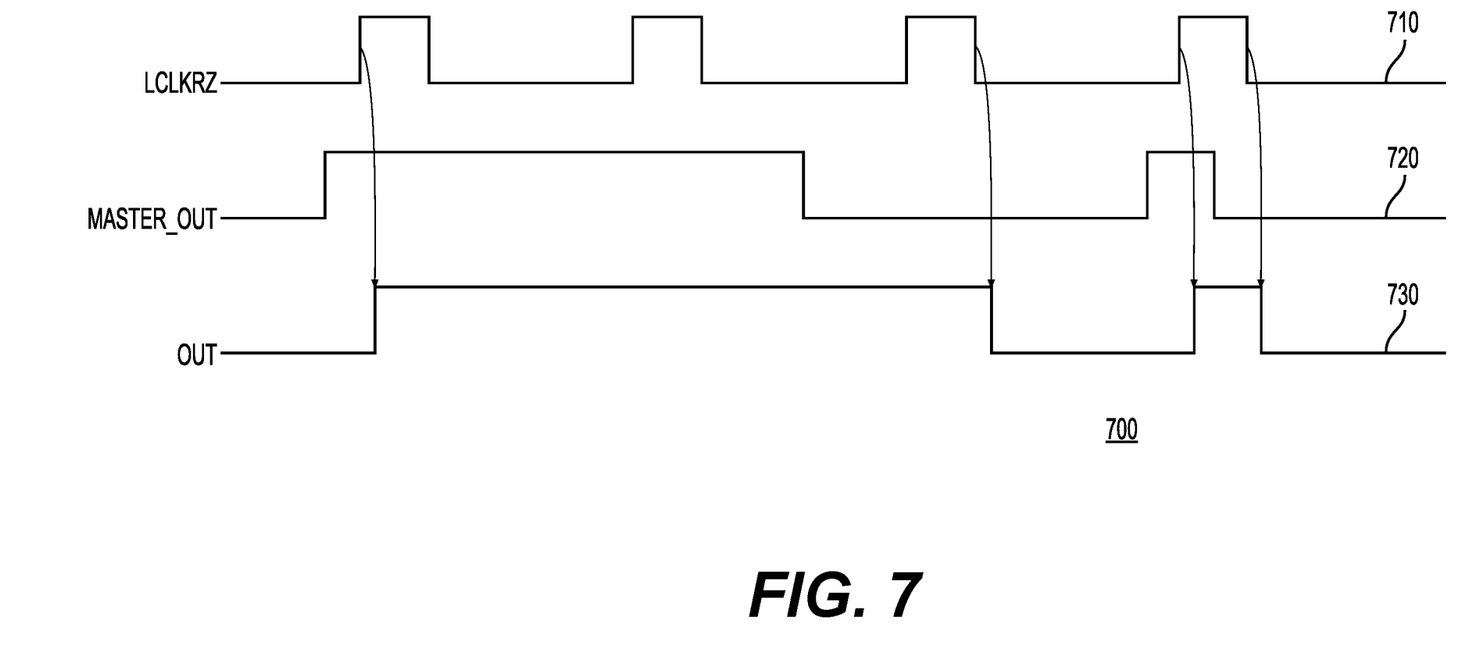
FIG. 7 shows waveforms associated with the slave latch of FIG. 6 in accordance with one example.

With continued reference to FIG. 6, in terms of the operation of slave latch 600, incoming data signal received via the MASTER_OUT terminal triggers JJ 604 and stores superconducting current in a loop formed by JJ 604, inductor 606, and JJ 610. The relative size of inductor 606 is selected such that the stored current by itself is not sufficient to trigger JJ 610 on its own. When the return-to-zero clock signal is received via the LCLKRZ terminal, JJ 610 is triggered and that results in the generation of a signal at node N2. That signal is then amplified by the other components of slave latch 600, including JJ 624, and the amplified signal is provided as an output signal via the output terminal OUT. The superconducting current in the storage loop can be circulating in both clockwise and counter-clockwise directions. If there is no current stored in the storage loop both positive and negative pulses will simply trigger the escape junction (JJ 622) and be rejected and cause no change in the output. If there is current stored in the storage loop it will preferentially bias JJ 610 and cause one of either positive or negative clock pulses to actually be routed to the output. If clockwise current is stored in the storage loop, a positive pulse will trigger JJ 610 and will be routed to the output terminal OUT. A negative pulse would still trigger the escape junction (JJ 622) and be rejected. Alternatively, if counter-clockwise current is stored in the storage loop, a negative pulse will trigger JJ 610 and will be routed to the output terminal OUT. A positive pulse would still trigger the escape junction (JJ 622) and be rejected. This allows slave latch 600 to be sensitive to both the rising edge and the falling edge of the return-to-zero clock signal. Although FIG. 6 shows a certain number of components of slave latch 600 arranged in a certain manner, there could be more or fewer number of components arranged differently FIG. 7 shows waveforms associated with slave latch 600 of FIG. 6, plotted in superconducting phase, in accordance with one example. The included waveforms illustrate the logical operation of slave latch 600 and demonstrate how logical "1" (or logical high) values are captured by the rising edge of the return-to-zero clock signal received via the LCLKRZ terminal and how logical "0" (or logical low) values are captured by the falling edge of the return-to-zero clock signal received via the LCLKRZ terminal. Waveform 710 represents the return-to-zero clock signal received via the LCLKRZ terminal. Waveform 720 represents the data signal received via the MASTER_OUT terminal. Waveform 730 shows the output signal at the output terminal OUT.

Figure 8:
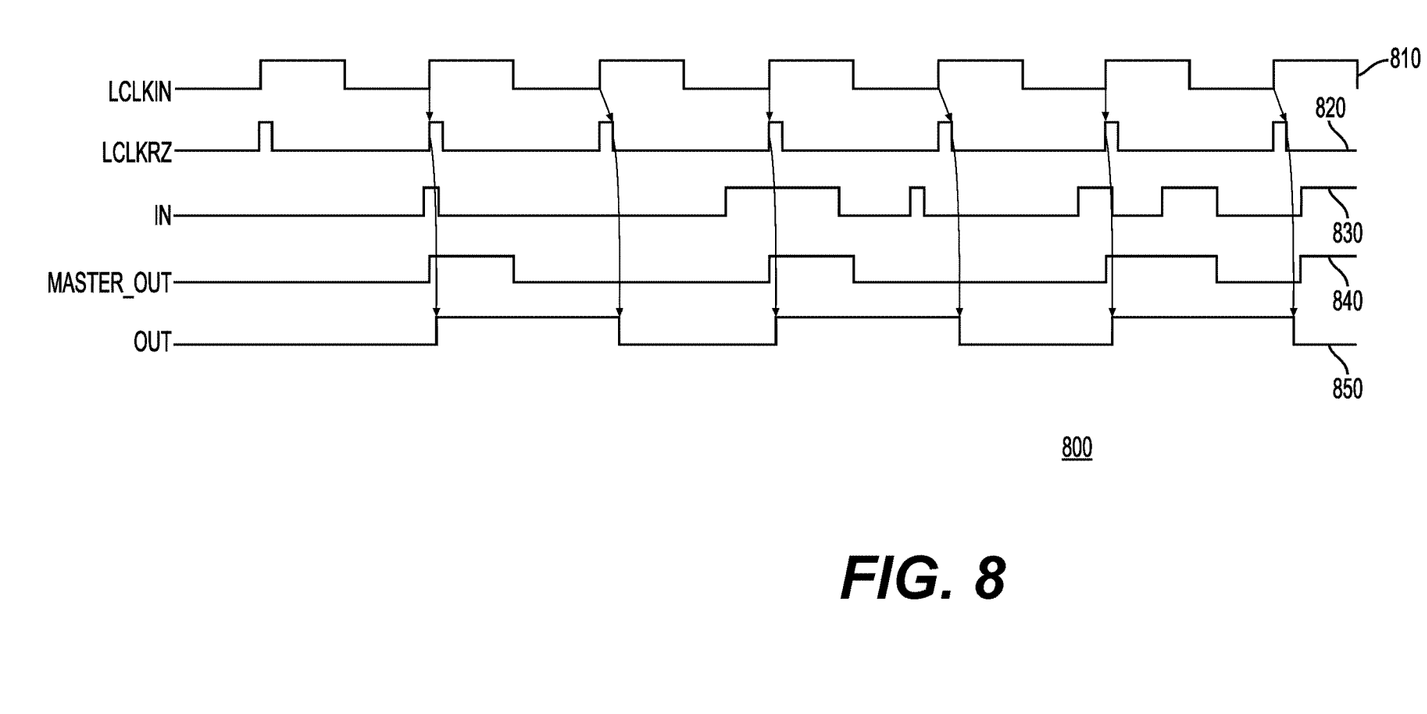
FIG. 8 shows waveforms associated with the edge-triggered superconducting circuit of FIG. 1 in accordance with one example.

FIG. 8 shows waveforms 800 associated with edge-triggered superconducting circuit 100 of FIG. 1 in accordance with one example. During example operation of edge-triggered superconducting circuit 100, edge detect circuit 110 generates an RZ pulse pair (waveform 820) for each rising edge of the logical clock signal (waveform 810). This pulse pair is used to clock slave latch 130. The logical clock signal (waveform 810) is used to clock master latch 120. When the logical clock signal is low, master latch 120 is transparent to falling edges of the input data signal that is received via the input terminal IN. This allows the input data signal to propagate all the way through to the storage loop (described earlier) of slave latch 130 (waveform 840). In this example, rising edges of the input data signal are held in the master latch's storage loop (described earlier). When a rising edge of the logical clock signal is received via the LCLKIN terminal, master latch 120 becomes transparent to rising edges of the input data signal received via the input terminal IN, and any waiting positive pulse in the storage loop associated with the master latch propagates forward to slave latch 130, putting positive current into the slave latch's storage loop or annihilating any negative pulse that was present in the slave latch's storage loop. In this example, approximately ¼ AC clock cycle later, the positive pulse of the return-to-zero pulse pair arrives via the LCLKRZ terminal at the slave latch and causes it to latch a logical "1" value if a positive pulse was present in the storage loop. Approximately ½ AC clock cycle after that, the negative pulse of the return-to-zero pulse pair arrives via the LCLKRZ terminal at the slave latch and causes it to latch a logical "0" value if a negative pulse was present in the storage loop. Advantageously, the example edge-triggered superconducting circuit 100 is capable of correctly latching the return-to-zero clock signal at the input terminal IN because the master latch will prevent the propagation of a negative pulse arriving at input terminal until after the falling edge of the logical clock signal. The duty cycle requirement is to ensure that the falling edge of the logical clock signal occurs after the falling edge of return-to-zero clock signal, thus preventing the slave latch from incorrectly latching a falling edge that arrived just after the rising edge of the logical clock signal until the next logical clock cycle. Waveforms 800 also indicate that in this example the chain of pulses that cause the output change always originate from the rising edge of the logical clock signal.

Figure 9:
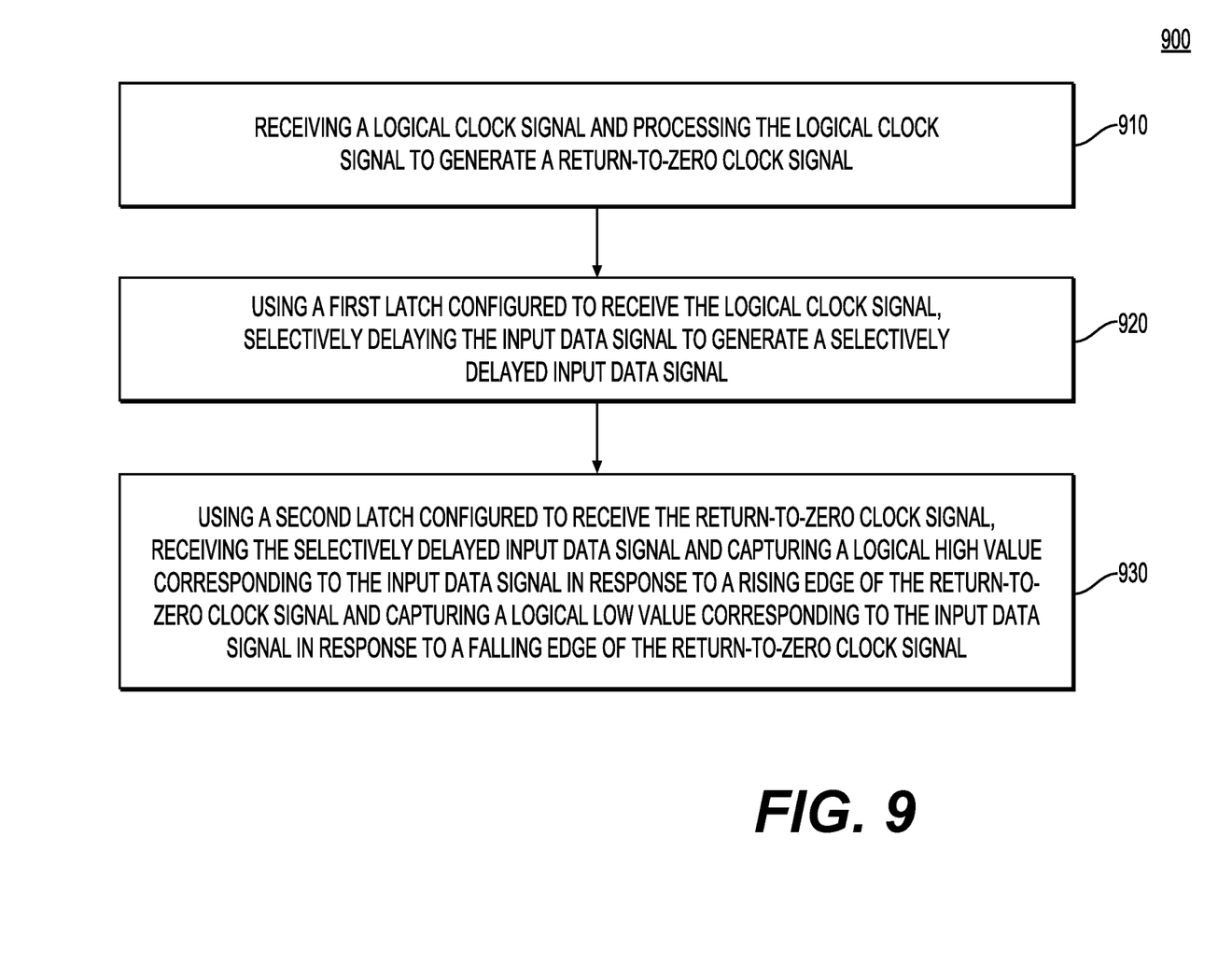
FIG. 9 shows a flowchart for a method associated with the edge-triggered superconducting circuit of FIG. 1 in accordance with one example.

FIG. 9 shows a flowchart 900 for a method associated with the edge-triggered superconducting circuit 100 of FIG. 1 in accordance with one example. Step 910 may include receiving a logical clock signal and processing the logical clock signal to generate a return-to-zero clock signal. As explained earlier, as an example, this step may be performed by edge detect circuit 110.

Step 920 may include using a first latch configured to receive the logical clock signal, delaying an input data signal to generate a delayed input data signal. As explained earlier, as an example, this step may be performed by master latch 120. In this example, master latch 120 is transparent to positive pulses (rising edges) when the logical clock is high and transparent to negative pulses (falling edges) when the logical clock is low. This allows master latch 120 to delay any falling edges that arrive in the first AC clock cycle after the rising edge of the logical clock until after the slave latch 130 has captured the new state.

Step 930 may include using a second latch configured to receive the return-to-zero clock signal, receiving the delayed input data signal and capturing a logical high value corresponding to the input data signal in response to a rising edge of the logical clock signal. As explained earlier, in one example, slave latch 130 may perform this step.

In conclusion, the present disclosure relates to a superconducting circuit for latching data. The superconducting circuit may include an edge detect circuit configured to receive a logical clock signal, where the edge detect circuit is further configured to generate a return-to-zero clock signal. The superconducting circuit may further include a first latch configured to receive the logical clock signal and an input data signal, where the first latch is further configured to selectively delay the input data signal to generate a delayed data signal. The superconducting circuit may further include a second latch configured to receive the return-to-zero clock signal and the delayed data signal, where the second latch is further configured to capture a logical high value corresponding to the input data signal in response to a rising edge of the return-to-zero clock signal, and where the second latch is further configured to capture a low logical value corresponding to the input data signal in response to a falling edge of the return-to-zero clock signal.

The second latch may further be configured to capture the logical high value corresponding to the input data signal only in response to the rising edge of the return-to-zero clock signal, and wherein the second latch is configured to capture the logical low value corresponding to the input data signal only in response to the falling edge of the return-to-zero clock signal.

The logical clock signal may comprise a phase mode logic signal. The return-to-zero clock signal may comprise at least one return-to-zero pulse pair.

The first latch may be configured to generate a logical high output value only when both the input data signal and the logical clock signal has a high value, and the first latch may be configured to generate a logical low output value only when both the input data signal and the logical clock signal has a low value. The first latch may be configured to receive a first alternating current bias having a first phase and the second latch may be configured to receive a second alternating current bias having a second phase, and where the second phase is 90 degrees later than the first phase.

The second latch may be configured to capture any values corresponding to the input data signal arriving prior to an arrival of a rising edge of the logical clock signal. The second latch may be configured to not capture any values corresponding to the input data signal arriving after an arrival of the rising edge of the logical clock signal.

In another aspect, the present disclosure relates to a method of operating a superconducting circuit. The method may include receiving a logical clock signal and processing the logical clock signal to generate a return-to-zero clock signal. The method may further include using a first latch configured to receive the logical clock signal, selectively delaying the input data signal to generate a delayed input data signal. The method may further include using a second latch configured to receive the return-to-zero clock signal, receiving the delayed input data signal and capturing a logical high value corresponding to the input data signal only in response to a rising edge of the return-to-zero clock signal and capturing a logical low value corresponding to the input data signal in response to a falling edge of the return-to-zero clock signal.

The method may further include using the second latch capturing the logical high value corresponding to the input data signal only in response to the rising edge of the return-to-zero clock signal and capturing the logical low value corresponding to the input data signal only in response to a falling edge of the return-to-zero clock signal.

The logical clock signal may comprise a phase mode logic signal. The return-to-zero clock signal may comprise at least one return-to-zero pulse pair.

The first latch may be configured to generate a logical high output value only when both the input data signal and the logical clock signal has a high value, and the first latch may be configured to generate a logical low output value only when both the input data signal and the logical clock signal has a low value.

The method may further include providing a first alternating current bias having a first phase to the first latch and providing a second alternating current bias having a second phase to the second latch, and where the second phase is 90 degrees later than the first phase. The method may further include capturing any values corresponding to the input data signal arriving prior to an arrival of a rising edge of the logical clock signal.

In yet another aspect, the present disclosure relates to a superconducting circuit comprising an edge detect circuit configured to receive a first clock signal, where the edge detect circuit is configured to generate a second clock signal. The superconducting circuit may further include a master latch configured to receive the first clock signal and an input data signal, where the master latch is further configured to selectively delay the input data signal to generate a delayed data signal. The superconducting circuit may further include a slave latch configured to receive the second clock signal and the delayed data signal, where the slave latch is further configured to capture a logical high value corresponding to the input data signal only at a rising edge of the second clock signal, and where the slave latch is further configured to capture a logical low value of the input data signal only at a falling edge of the second clock signal.

The first clock signal may be a logical clock signal and the second clock signal may be a return-to-zero clock signal. The logical clock signal may comprise a phase mode logic signal. The return-to-zero clock signal may comprise at least one return-to-zero pulse pair.

The first latch may be configured to generate a logical high output value only when both the input data signal and the logical clock signal has a high value, and the first latch may be configured to generate a logical low output value only when both the input data signal and the logical clock signal has a low value.

It is to be understood that the methods, modules, devices, systems, and components depicted herein are merely exemplary. Alternatively, or in addition, the functionally described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with the examples described in this disclosure can also include instructions stored in a non-transitory media. The term "non-transitory media" as used herein refers to any media storing data and/or instructions that cause a machine to operate in a specific manner. Exemplary non-transitory media include non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory, such as, DRAM, SRAM, a cache, or other such media. Non-transitory media is distinct from, but can be used in conjunction with transmission media. Transmission media is used for transferring data and/or instruction to or from a machine. Exemplary transmission media, include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A superconducting circuit comprising:
an edge detect circuit configured to receive a logical clock signal, wherein the edge detect circuit is further configured to generate a return-to-zero clock signal;
a first latch configured to receive the logical clock signal and an input data signal, wherein the first latch is further configured to selectively delay the input data signal to generate a delayed data signal; and
a second latch configured to receive the return-to-zero clock signal and the delayed data signal, wherein the second latch is further configured to capture a logical high value corresponding to the input data signal in response to a rising edge of the return-to-zero clock signal and capture a logical low value corresponding to the input data signal in response to a falling edge of the return-to-zero signal, wherein the first latch is configured to receive a first alternating current bias having a first phase and the second latch is configured to receive a second alternating current bias having a second phase, and wherein the second phase is different from the first phase.

2. The superconducting circuit of claim 1, wherein the second latch is configured to capture the logical high value corresponding to the input data signal only in response to the rising edge of the return-to-zero clock signal, and wherein the second latch is configured to capture the logical low value corresponding to the input data signal only in response to the falling edge of the return-to-zero clock signal.

3. The superconducting circuit of claim 1, wherein the logical clock signal comprises a phase mode logic signal.

4. The superconducting circuit of claim 1, wherein the return-to-zero clock signal comprises at least one return-to-zero pulse pair.

5. The superconducting circuit of claim 1, wherein the first latch is configured to generate a logical high output value only when both the input data signal and the logical clock signal has a high value, and wherein the first latch is configured to generate a logical low output value only when both the input data signal and the logical clock signal has a low value.

6. The superconducting circuit of claim 1, wherein the second phase is 90 degrees later than the first phase.

7. The superconducting circuit of claim 1, wherein the second latch is configured to capture any values corresponding to the input data signal arriving prior to an arrival of a rising edge of the logical clock signal.

8. The superconducting circuit of claim 7, wherein the second latch is configured to not capture any values corresponding to the input data signal arriving after an arrival of the rising edge of the logical clock signal.

9. A method of operating a superconducting circuit comprising:
receiving a logical clock signal and processing the logical clock signal to generate a return-to-zero clock signal;
using a first latch configured to receive the logical clock signal, selectively delaying the input data signal to generate a delayed input data signal; and
using a second latch configured to receive the return-to-zero clock signal, receiving the delayed input data signal and capturing a logical high value corresponding to the input data signal in response to a rising edge of the return-to-zero clock signal and capturing a logical low value corresponding to the input data signal in response to a falling edge of the return-to-zero clock signal, wherein the first latch is configured to receive a first alternating current bias having a first phase and the second latch is configured to receive a second alternating current bias having a second phase, and wherein the second phase is different from the first phase.

10. The method of claim 9 further comprising using the second latch capturing the logical high value corresponding to the input data signal only in response to the rising edge of the return-to-zero clock signal and capturing the logical low value corresponding to the input data signal only in response to a falling edge of the return-to-zero clock signal.

11. The method of claim 9, wherein the logical clock signal comprises a phase mode logic signal.

12. The method of claim 9, wherein the return-to-zero clock signal comprises at least one return-to-zero pulse pair.

13. The method of claim 9, wherein the first latch is configured to generate a logical high output value only when both the input data signal and the logical clock signal has a high value, and wherein the first latch is configured to generate a logical low output value only when both the input data signal and the logical clock signal has a low value.

14. The method of claim 9, wherein the second phase is 90 degrees later than the first phase.

15. The method of claim 14 further comprising capturing any values corresponding to the input data signal arriving prior to an arrival of a rising edge of the logical clock signal.

16. A superconducting circuit comprising:

an edge detect circuit configured to receive a first clock signal, wherein the edge detect circuit is configured to generate a second clock signal;

a master latch configured to receive the first clock signal and an input data signal, wherein the master latch is further configured to selectively delay the input data signal to generate a delayed data signal; and a slave latch configured to receive the second clock signal and the delayed data signal, wherein the slave latch is further configured to capture a logical high value corresponding to the input data signal only at a rising edge of the second clock signal, and wherein the slave latch is further configured to capture a logical low value of the input data signal only at a falling edge of the second clock signal, wherein the master latch is configured to receive a first alternating current bias having a first phase and the slave latch is configured to receive a second alternating current bias having a second phase, and wherein the second phase is different from the first phase.

17. The superconducting circuit of claim 16, wherein the first clock signal comprises a logical clock signal, and wherein the second clock signal comprises a return-to-zero clock signal.

18. The superconducting circuit of claim 17, wherein the logical clock signal comprises a phase mode logic signal.

19. The superconducting circuit of claim 17, wherein the return-to-zero clock signal comprises at least one return-to-zero pulse pair.

20. The superconducting circuit of claim 17, wherein the master latch is configured to generate a logical high output value only when both the input data signal and the logical clock signal has a high value, and wherein the master latch is configured to generate a logical low output value only when both the input data signal and the logical clock signal has a low value.

* * * * *